(12) United States Patent
Blankenship et al.

(10) Patent No.: US 9,399,383 B2
(45) Date of Patent: Jul. 26, 2016

(54) DAMPER WITH INTEGRATED ELECTRONICS

(71) Applicant: Tenneco Automotive Operating Company Inc., Lake Forest, IL (US)

(72) Inventors: David R. Blankenship, Canton, MI (US); Karl C. Kazmirski, Temperance, MI (US); Scott S. Dunaway, Carleton, MI (US); Jeroen K. Paenhuysen, Ypsilanti, MI (US); Matthew L. Roessle, Temperance, MI (US); Matthew R. Schelosky, Temperance, MI (US)

(73) Assignee: Tenneco Automotive Operating Company Inc., Lake Forest, IL (US)

( * ) Notice: Subject to any disclaimer, the term of this patent is extended or adjusted under 35 U.S.C. 154(b) by 15 days.

(21) Appl. No.: 14/193,879

(22) Filed: Feb. 28, 2014

(65) Prior Publication Data

US 2014/0238797 A1 Aug. 28, 2014

Related U.S. Application Data

(60) Provisional application No. 61/770,426, filed on Feb. 28, 2013.

(51) Int. Cl.
*F16F 9/34* (2006.01)
*B60G 17/08* (2006.01)
*F16F 9/46* (2006.01)
(Continued)

(52) U.S. Cl.
CPC ............. *B60G 17/08* (2013.01); *B60G 13/00* (2013.01); *B60G 17/015* (2013.01); *B60G 17/0152* (2013.01); *B60G 17/01908* (2013.01); *F16F 9/3207* (2013.01); *F16F 9/3292* (2013.01); *F16F 9/463* (2013.01); *F16F 9/464* (2013.01); *B60G 2202/24* (2013.01); *B60G 2204/112* (2013.01); *B60G 2401/17* (2013.01);
(Continued)

(58) Field of Classification Search
CPC ......... F16F 9/463; F16F 9/464; F16F 9/3207; B60G 17/015; B60G 17/0152
USPC .......... 188/266.1, 266.2, 266.3, 266.4, 266.5, 188/266.6, 266.7, 282.2, 282.3, 282.4, 188/299.1
See application file for complete search history.

(56) References Cited

U.S. PATENT DOCUMENTS 3,945,474 A 3/1976 Palmer
4,552,324 A 11/1985 Hrusch
(Continued)

FOREIGN PATENT DOCUMENTS

DE 3928343 A1 2/1991
DE 19853277 C1 5/2000
(Continued)

OTHER PUBLICATIONS

Search Report and Written Opinion dated Jun. 20, 2014 in corresponding PCT Application No. PCT/US2014/019534 (12 pages).

*Primary Examiner* — Thomas J Williams
(74) *Attorney, Agent, or Firm* — Harness, Dickey & Pierce, P.L.C.

(57) ABSTRACT

A damper system for a vehicle comprises an electrically adjustable hydraulic shock absorber and a printed circuit board assembly. The printed circuit board assembly includes power drive electronics, and is electrically coupled to the shock absorber. The printed circuit board assembly is disposed with the shock absorber.

8 Claims, 8 Drawing Sheets

(51) Int. Cl.
  *B60G 17/015*   (2006.01)
  *B60G 17/019*   (2006.01)
  *B60G 13/00*    (2006.01)
  *F16F 9/32*     (2006.01)

(52) U.S. Cl.
  CPC ..... *B60G2500/114* (2013.01); *B60G 2600/182* (2013.01); *B60G 2800/162* (2013.01)

(56) References Cited

U.S. PATENT DOCUMENTS

| | | | |
|---|---|---|---|
| 4,589,528 A | | 5/1986 | Axthammer et al. |
| 4,749,070 A | | 6/1988 | Moser et al. |
| 4,776,437 A | * | 10/1988 | Ishibashi et al. ........... 188/266.4 |
| 4,788,489 A | | 11/1988 | Kobayashi et al. |
| 4,846,317 A | | 7/1989 | Hudgens |
| 4,850,460 A | | 7/1989 | Knecht et al. |
| 4,867,476 A | | 9/1989 | Yamanaka et al. |
| 4,872,537 A | | 10/1989 | Warner |
| 4,892,328 A | | 1/1990 | Kurtzman et al. |
| 4,909,536 A | | 3/1990 | Hale |
| 4,943,083 A | * | 7/1990 | Groves et al. ............. 188/266.1 |
| 4,958,706 A | | 9/1990 | Richardson et al. |
| 4,969,662 A | | 11/1990 | Stuart |
| 4,973,854 A | | 11/1990 | Hummel |
| 4,986,393 A | | 1/1991 | Preukschat et al. |
| 5,038,613 A | | 8/1991 | Takenaka et al. |
| 5,133,434 A | | 7/1992 | Kikushima et al. |
| 5,143,185 A | | 9/1992 | Klein et al. |
| 5,154,442 A | | 10/1992 | Milliken |
| 5,189,614 A | | 2/1993 | Mitsuoka et al. |
| 5,200,895 A | | 4/1993 | Emura et al. |
| 5,242,190 A | * | 9/1993 | Morris ....................... 280/5.503 |
| 5,293,968 A | | 3/1994 | Schuelke et al. |
| 5,299,488 A | | 4/1994 | Kadlicko et al. |
| 5,350,187 A | | 9/1994 | Shinozaki |
| 5,350,983 A | | 9/1994 | Miller et al. |
| 5,360,089 A | | 11/1994 | Nakamura et al. |
| 5,363,945 A | | 11/1994 | Lizell et al. |
| 5,383,679 A | * | 1/1995 | Nakamura et al. ......... 280/5.507 |
| 5,396,973 A | | 3/1995 | Schwemmer et al. |
| 5,404,973 A | | 4/1995 | Katoh et al. |
| 5,430,648 A | | 7/1995 | Sasaki |
| 5,485,417 A | | 1/1996 | Wolf et al. |
| 5,487,455 A | | 1/1996 | Feigel |
| 5,497,325 A | | 3/1996 | Mine |
| 5,497,862 A | | 3/1996 | Hoya |
| 5,532,921 A | | 7/1996 | Katsuda |
| 5,570,762 A | | 11/1996 | Jentsch et al. |
| 5,597,054 A | | 1/1997 | Nagai et al. |
| 5,632,503 A | | 5/1997 | Raad et al. |
| 5,653,315 A | | 8/1997 | Ekquist et al. |
| 5,655,633 A | | 8/1997 | Nakadate et al. |
| 5,690,195 A | | 11/1997 | Kruckemeyer et al. |
| 5,725,239 A | | 3/1998 | de Molina |
| 5,775,470 A | | 7/1998 | Feigel |
| 5,803,482 A | | 9/1998 | Kim |
| 5,833,036 A | | 11/1998 | Gillespie |
| 5,845,672 A | * | 12/1998 | Reuter et al. ............. 137/315.03 |
| 5,860,497 A | | 1/1999 | Takahashi |
| 5,878,851 A | | 3/1999 | Carlson et al. |
| 5,913,391 A | | 6/1999 | Jeffries et al. |
| 5,937,976 A | | 8/1999 | Grundei |
| 5,950,775 A | | 9/1999 | Achmad |
| 5,967,268 A | | 10/1999 | de Molina et al. |
| 5,987,369 A | | 11/1999 | Kwak et al. |
| 6,003,644 A | | 12/1999 | Tanaka |
| 6,036,500 A | | 3/2000 | Francis et al. |
| 6,095,489 A | * | 8/2000 | Kaneko et al. ........... 251/129.15 |
| 6,109,400 A | | 8/2000 | Ayyildiz et al. |
| 6,155,391 A | | 12/2000 | Kashiwagi et al. |
| 6,213,262 B1 | | 4/2001 | Bell |
| 6,273,224 B1 | | 8/2001 | Achmad |
| 6,296,091 B1 | | 10/2001 | Hamilton |
| 6,302,248 B1 | | 10/2001 | Nakadate |
| 6,321,888 B1 | | 11/2001 | Reybrouck et al. |
| 6,343,677 B2 | | 2/2002 | Bell |
| 6,427,986 B1 | | 8/2002 | Sakai et al. |
| 6,460,664 B1 | | 10/2002 | Steed et al. |
| 6,533,294 B1 | | 3/2003 | Germain et al. |
| 6,588,726 B2 | | 7/2003 | Osterhart et al. |
| 6,616,124 B2 | | 9/2003 | Oliver et al. |
| 6,651,787 B2 | | 11/2003 | Grundei |
| 6,655,512 B2 | | 12/2003 | Moradmand et al. |
| 6,672,436 B1 | | 1/2004 | Keil et al. |
| 6,708,803 B2 | | 3/2004 | Jensen |
| 6,814,193 B2 | | 11/2004 | Grundei |
| 6,851,528 B2 | | 2/2005 | Lemieux |
| 6,879,898 B2 | | 4/2005 | Ghoneim et al. |
| 6,904,344 B2 | | 6/2005 | LaPlante et al. |
| 6,959,797 B2 | | 11/2005 | Mintgen et al. |
| 6,964,325 B2 | | 11/2005 | Maes |
| 6,978,872 B2 | | 12/2005 | Turner |
| 7,032,912 B2 | | 4/2006 | Nicot et al. |
| 7,168,709 B2 | | 1/2007 | Niwa et al. |
| 7,214,103 B2 | * | 5/2007 | Kim et al. ...................... 439/680 |
| 7,234,574 B2 | | 6/2007 | Matsunaga et al. |
| 7,234,707 B2 | | 6/2007 | Green et al. |
| 7,273,138 B2 | | 9/2007 | Park |
| 7,286,919 B2 | | 10/2007 | Nordgren et al. |
| 7,318,595 B2 | | 1/2008 | Lamela et al. |
| 7,347,307 B2 | | 3/2008 | Joly |
| 7,374,028 B2 | | 5/2008 | Fox |
| 7,389,994 B2 | | 6/2008 | Trudeau et al. |
| 7,413,062 B2 | | 8/2008 | Vandewal |
| 7,416,189 B2 | | 8/2008 | Wilde et al. |
| 7,475,538 B2 | | 1/2009 | Bishop |
| 7,493,995 B2 | | 2/2009 | Sas et al. |
| 7,604,101 B2 | | 10/2009 | Park |
| 7,611,000 B2 | | 11/2009 | Naito |
| 7,628,253 B2 | | 12/2009 | Jin et al. |
| 7,644,933 B2 | | 1/2010 | Brookes et al. |
| 7,654,369 B2 | | 2/2010 | Murray et al. |
| 7,654,370 B2 | | 2/2010 | Cubalchini, Jr. |
| 7,680,573 B2 | | 3/2010 | Ogawa |
| 7,722,405 B2 | | 5/2010 | Jaklin et al. |
| 7,770,983 B2 | | 8/2010 | Park |
| 7,775,333 B2 | | 8/2010 | Or et al. |
| 7,849,983 B2 | | 12/2010 | St. Clair et al. |
| 7,878,311 B2 | | 2/2011 | Van Weelden et al. |
| 7,896,311 B2 | | 3/2011 | Jee |
| 7,912,603 B2 | | 3/2011 | Stiller et al. |
| 7,926,513 B2 | | 4/2011 | Ishibashi et al. |
| 7,931,282 B2 | | 4/2011 | Kolp et al. |
| 7,942,248 B2 | | 5/2011 | St. Clair et al. |
| 7,946,163 B2 | | 5/2011 | Gartner |
| 7,946,399 B2 | | 5/2011 | Masamura |
| 7,967,116 B2 | | 6/2011 | Boerschig |
| 7,967,117 B2 | | 6/2011 | Abe |
| 7,992,692 B2 | | 8/2011 | Lee et al. |
| 7,997,394 B2 | | 8/2011 | Yamaguchi |
| 8,056,392 B2 | | 11/2011 | Ryan et al. |
| 8,075,002 B1 | | 12/2011 | Pionke et al. |
| 8,116,939 B2 | | 2/2012 | Kajino et al. |
| 8,132,654 B2 | | 3/2012 | Widla et al. |
| 8,136,644 B2 | | 3/2012 | Sonsterod |
| 8,160,774 B2 | | 4/2012 | Li et al. |
| 8,214,106 B2 | | 7/2012 | Ghoneim et al. |
| 8,267,382 B2 | | 9/2012 | Yazaki et al. |
| 8,393,446 B2 | | 3/2013 | Haugen |
| 8,430,217 B2 | | 4/2013 | Hennecke et al. |
| 8,567,575 B2 | | 10/2013 | Jung et al. |
| 8,616,351 B2 | | 12/2013 | Roessle et al. |
| 8,666,596 B2 | | 3/2014 | Arenz |
| 8,684,367 B2 | | 4/2014 | Haugen |
| 8,695,766 B2 | | 4/2014 | Yamashita et al. |
| 8,794,405 B2 | | 8/2014 | Yamashita et al. |
| 8,844,687 B2 | | 9/2014 | Yu et al. |
| 9,150,077 B2 | * | 10/2015 | Roessle ................... F16F 9/348 |
| 9,163,691 B2 | * | 10/2015 | Roessle ................... F16F 9/185 |
| 9,217,483 B2 | * | 12/2015 | Dunaway ........... B60G 17/0152 |
| 2002/0133277 A1 | | 9/2002 | Koh |
| 2003/0164193 A1 | | 9/2003 | Lou |
| 2003/0192755 A1 | | 10/2003 | Barbison et al. |

(56) References Cited

U.S. PATENT DOCUMENTS

| | | |
|---|---|---|
| 2004/0090020 A1 | 5/2004 | Braswell |
| 2004/0199313 A1 | 10/2004 | Dellinger |
| 2005/0029063 A1 | 2/2005 | Neumann |
| 2005/0056502 A1 | 3/2005 | Maes |
| 2005/0085969 A1 | 4/2005 | Kim |
| 2005/0113997 A1 | 5/2005 | Kim |
| 2005/0173849 A1 | 8/2005 | Vandewal |
| 2006/0038149 A1* | 2/2006 | Albert et al. ............ 251/129.01 |
| 2006/0124415 A1 | 6/2006 | Joly |
| 2006/0219503 A1 | 10/2006 | Kim |
| 2007/0034466 A1 | 2/2007 | Paesmans et al. |
| 2007/0051574 A1 | 3/2007 | Keil et al. |
| 2008/0054537 A1 | 3/2008 | Harrison |
| 2008/0243336 A1 | 10/2008 | Fitzgibbons |
| 2008/0250844 A1 | 10/2008 | Gartner |
| 2008/0264743 A1* | 10/2008 | Lee et al. ...................... 188/266 |
| 2008/0277218 A1 | 11/2008 | Fox |
| 2009/0071772 A1* | 3/2009 | Cho et al. ................... 188/266.4 |
| 2009/0078517 A1 | 3/2009 | Maneyama et al. |
| 2009/0084647 A1 | 4/2009 | Maneyama et al. |
| 2009/0132122 A1 | 5/2009 | Kim et al. |
| 2009/0192673 A1 | 7/2009 | Song et al. |
| 2010/0001217 A1 | 1/2010 | Jee et al. |
| 2010/0044172 A1 | 2/2010 | Jee et al. |
| 2010/0066051 A1 | 3/2010 | Haugen |
| 2010/0163354 A1 | 7/2010 | Braun |
| 2010/0181154 A1 | 7/2010 | Panichgasem |
| 2010/0191420 A1 | 7/2010 | Honma et al. |
| 2010/0211253 A1 | 8/2010 | Morais Dos Santos et al. |
| 2011/0035091 A1 | 2/2011 | Yamamoto |
| 2011/0056780 A1 | 3/2011 | St.Clair et al. |
| 2011/0056783 A1 | 3/2011 | Teraoka et al. |
| 2011/0079475 A1 | 4/2011 | Roessle et al. |
| 2011/0101579 A1 | 5/2011 | Polakowski et al. |
| 2011/0198172 A1 | 8/2011 | Whan |
| 2011/0240424 A1 | 10/2011 | Beck |
| 2011/0298399 A1 | 12/2011 | Ogawa et al. |
| 2012/0018263 A1 | 1/2012 | Marking |
| 2012/0048665 A1 | 3/2012 | Marking |
| 2012/0181126 A1 | 7/2012 | de Kock |
| 2012/0186922 A1 | 7/2012 | Battlogg et al. |
| 2012/0228072 A1 | 9/2012 | Mangelschots et al. |
| 2013/0090808 A1 | 4/2013 | Lemme et al. |
| 2013/0234379 A1 | 9/2013 | Panichgasem |
| 2013/0313057 A1 | 11/2013 | Tsukahara et al. |
| 2013/0328277 A1 | 12/2013 | Ryan et al. |
| 2013/0340865 A1 | 12/2013 | Manger et al. |
| 2013/0341842 A1 | 12/2013 | Weber |
| 2014/0102842 A1 | 4/2014 | Roessle et al. |
| 2014/0125018 A1 | 5/2014 | Brady et al. |
| 2014/0202808 A1 | 7/2014 | Spyche, Jr. et al. |
| 2014/0231200 A1 | 8/2014 | Katayama |

FOREIGN PATENT DOCUMENTS

| | | |
|---|---|---|
| DE | 10238657 A1 | 3/2004 |
| EP | 1588072 A1 | 10/2005 |
| EP | 1746302 A1 | 1/2007 |
| GB | 2123922 A | 2/1984 |
| JP | 61125907 | 6/1986 |
| JP | 62-253506 | 11/1987 |
| JP | 06-026546 | 2/1994 |
| JP | 07-113434 | 5/1995 |
| JP | 7056311 | 6/1995 |
| JP | 08-260747 | 10/1996 |
| JP | 09-217779 | 8/1997 |
| JP | 2002-349630 A | 12/2002 |
| WO | 9218788 A1 | 10/1992 |
| WO | WO 2010029133 A1 * | 3/2010 |

* cited by examiner

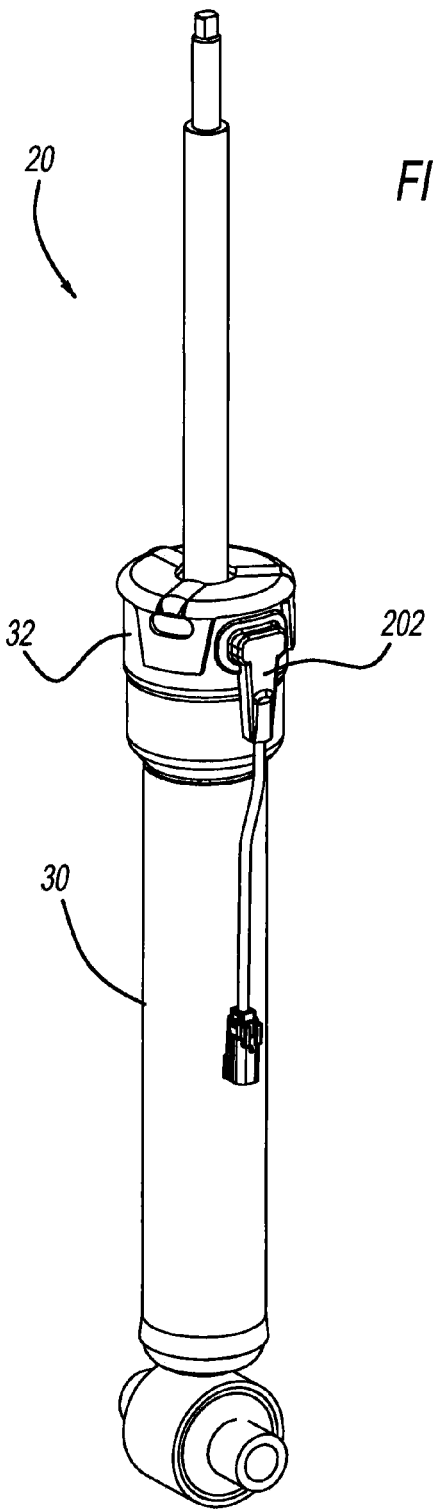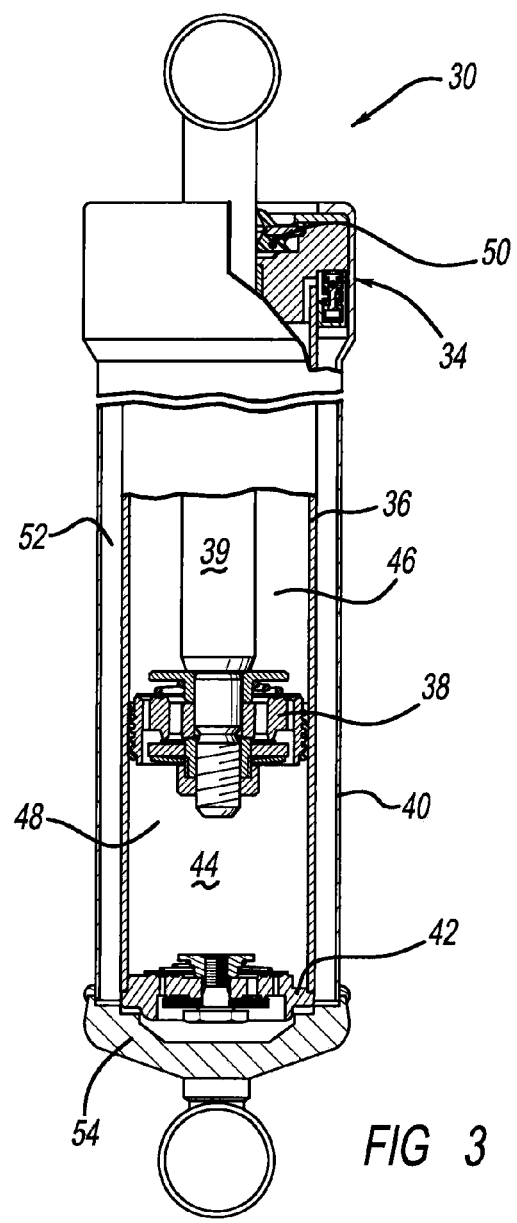
FIG 2
FIG 3

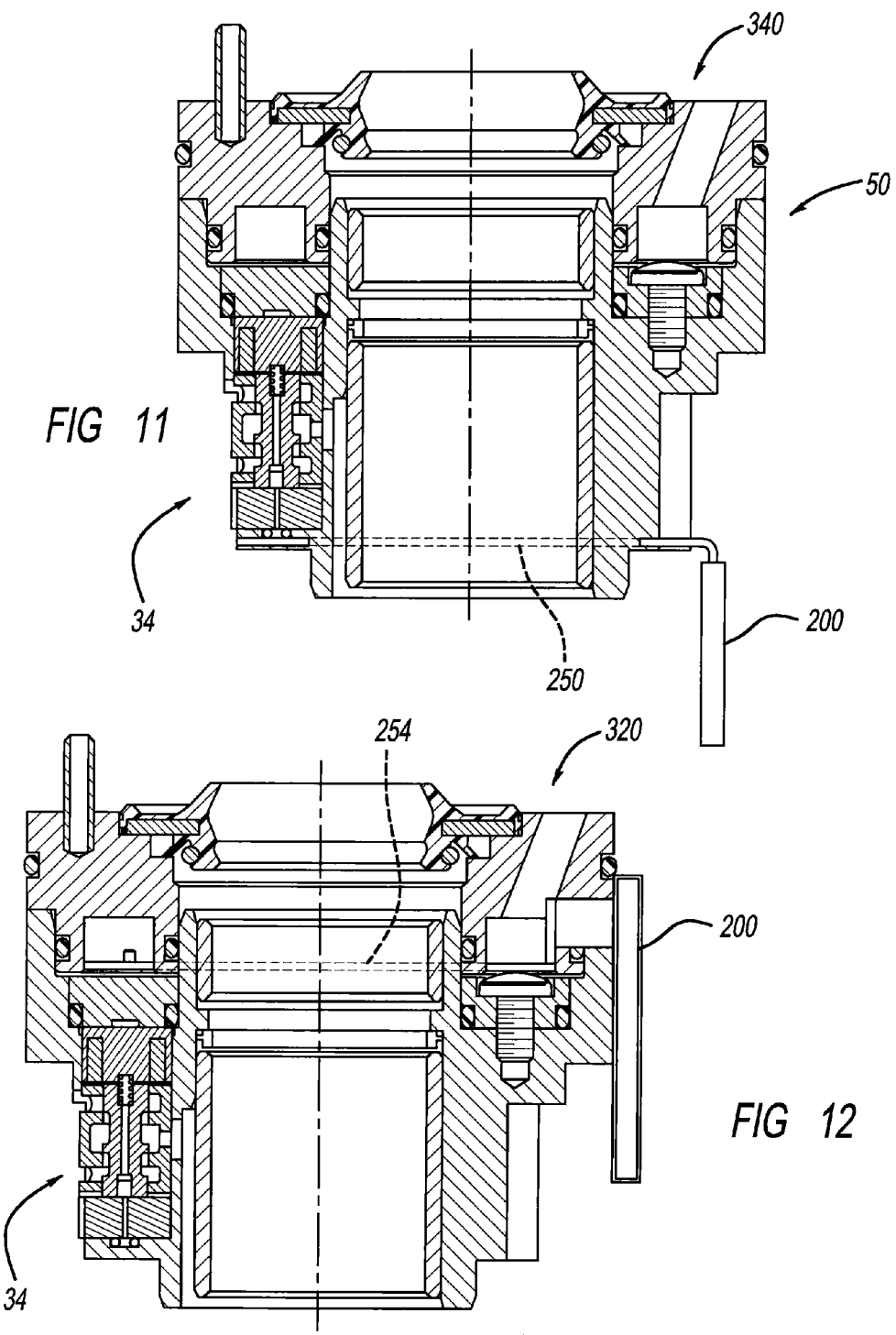

DAMPER WITH INTEGRATED ELECTRONICS

CROSS-REFERENCE TO RELATED APPLICATIONS

This application claims the benefit of U.S. Provisional Application No. 61/770,426, filed on Feb. 28, 2013. The entire disclosure of the above application is incorporated herein by reference.

FIELD

The present disclosure relates to a hydraulic damper or shock absorber for use in a suspension system of a vehicle. More particularly, to a damper having an integrated electronic system.

BACKGROUND

This section provides background information related to the present disclosure which is not necessarily prior art.

Shock absorbers are used in conjunction with automotive suspension systems to absorb unwanted vibrations which occur during driving. To absorb the unwanted vibrations, shock absorbers are generally connected between the sprung portion (body) and the unsprung portion (suspension) of the automobile.

In recent years, vehicles may be equipped with an electrically adjustable damping system that includes an electrically adjustable hydraulic shock absorber. Such adjustable shock absorbers may include an electromechanical valve/actuator disposed therein. A main control unit disposed within the vehicle is used to control the damping state of each of the adjustable shock absorber by controlling the actuation of the electromechanical valve.

SUMMARY

This section provides a general summary of the disclosure, and is not a comprehensive disclosure of its full scope or all of its features.

The present disclosure provides for a damper system for a vehicle. The damper system includes an electrically adjustable hydraulic shock absorber and an integrated electronic system, such as a printed circuit board assembly. The integrated electronic system includes power drive electronics, and is electrically coupled to the shock absorber. The integrated electronic system is further disposed with the shock absorber.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 is a perspective view of an example of the damper system;

FIG. 3 is a partial cross-sectional view of the shock absorber of the damper system;

FIG. 11 illustrates an inverted-wet arrangement of the PCBA;

FIG. 12 illustrates an external arrangement of the PCBA; and

Corresponding reference numerals indicate corresponding parts throughout the several views of the drawings.

DETAILED DESCRIPTION

Figure 1:
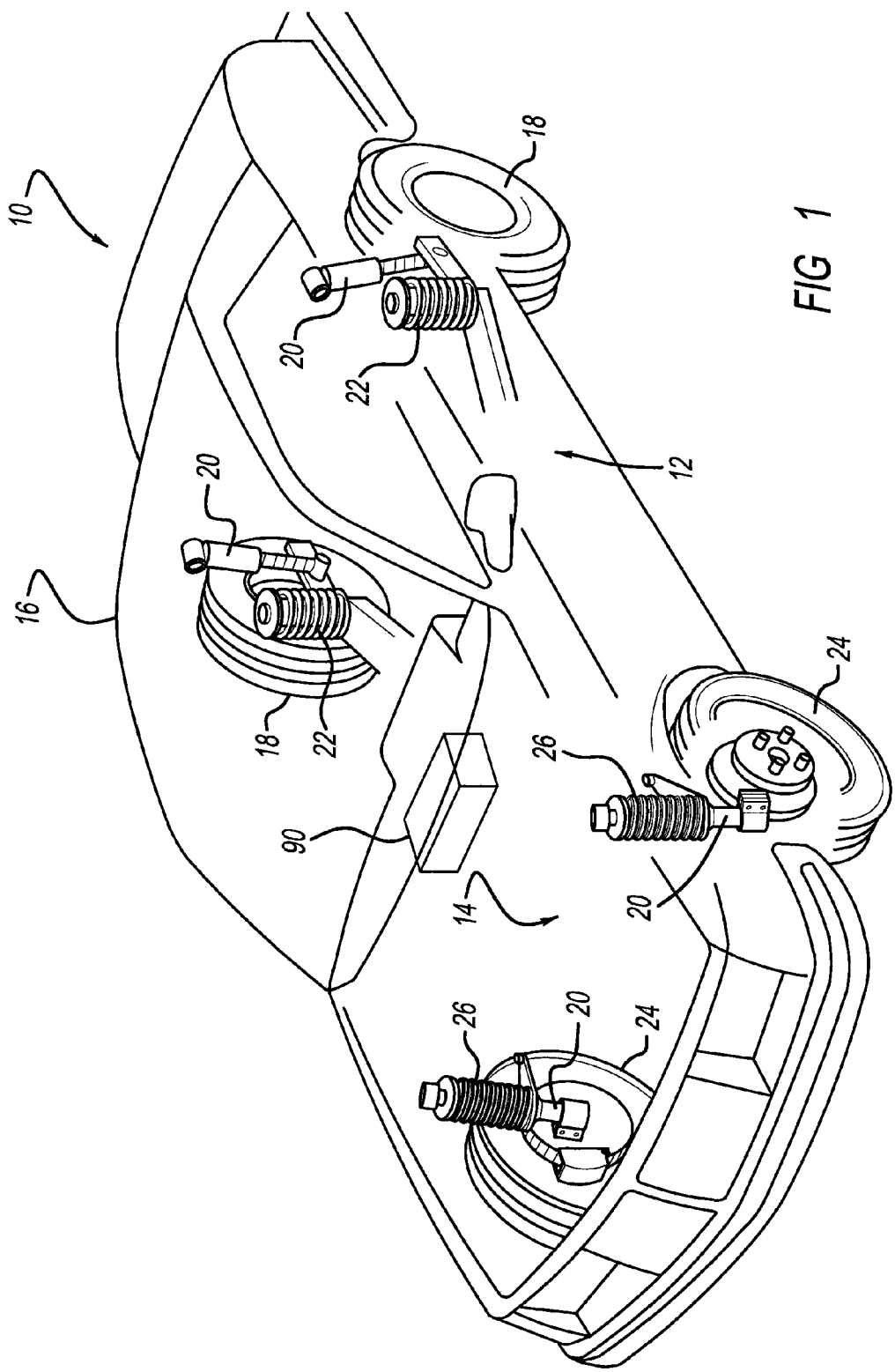
FIG. 1 is an illustration of a vehicle having a damper system which incorporates an electrically adjustable hydraulic shock absorber and a damper module in accordance with the present disclosure.

The present disclosure will now be described more fully with reference to the accompanying drawings. With reference to FIG. 1, an example of a vehicle 10 incorporating a suspension system having dampers with an integrated electronic system is now presented. The vehicle 10 includes a rear suspension 12, a front suspension 14, and a body 16. The rear suspension 12 has a transversely extending rear axle assembly (not shown) adapted to operatively support a pair of rear wheels 18. The rear axle assembly is attached to the body 16 by means of a pair of damper systems 20 and by a pair of springs 22. Similarly, the front suspension 14 includes a transversely extending front axle assembly (not shown) to operatively support a pair of front wheels 24. The front axle assembly is attached to the body 16 by means of a pair of the damper systems 20 and by a pair of springs 26.

The damper systems 20 serve to dampen the relative motion of the unsprung portion (i.e., front and rear suspensions 12, 14) with respect to the sprung portion (i.e., body 16) of vehicle 10. While the vehicle 10 has been depicted as a passenger car having front and rear axle assemblies, the damper system 20 may be used with other types of vehicles or in other types of applications including, but not limited to, vehicles incorporating non-independent front and/or non-independent rear suspensions, vehicles incorporating independent front and/or independent rear suspensions or other suspension systems known in the art. In addition, the damper system 20 may also be used on all wheeled and/or tracked vehicles. For example the damper system 20 may be used on two and/or three wheels type of vehicles, such as motorcycles and all-terrain vehicles.

Referring now to FIGS. 2-3, an example of the damper system 20 is shown in greater detail. The damper system 20 includes an electrically adjustable hydraulic shock absorber 30 ("shock absorber 30" hereinafter) and a damper module (DM) 32. As shown in FIG. 3, the shock absorber 30 may have a twin tube configuration. The shock absorber 30 may include a pressure tube 36, a piston assembly 38, a piston rod 39, a reserve tube 40 and a base valve assembly 42.

In the example embodiment described herein, the damper system 20 is described and depicted as including a twin tube electrically adjustable shock absorber. It is readily understood that the damper system 20 may include other types of electrically adjustable hydraulic shock absorber and is not limited to the shock absorber described herein. For example, the damper system 20 may include an electrically adjustable shock absorber having a mono-tube configuration, a triple-tube configuration, or any other suitable shock absorber design known in the art. Furthermore, in the following description, the shock absorber is connected to the sprung and unsprung portions of the vehicle as a non-inverted shock absorber. It is readily understood that the present disclosure is further applicable to inverted shock absorbers, which differ in the manner in which it is connected to the sprung and unsprung portions of vehicle.

The pressure tube 36 defines a working chamber 44. The piston assembly 38 is slidably disposed within the pressure tube 36 and divides the working chamber 44 into an upper working chamber 46 and a lower working chamber 48.

The piston rod 39 is attached to the piston assembly 38 and extends through the upper working chamber 46 and through a rod guide assembly 50 which closes the upper end of the pressure tube 36. The end of the piston rod 39 opposite to the piston assembly 38 is adapted to be secured to the sprung mass of the vehicle 10.

Valving within the piston assembly 38 controls the movement of fluid between the upper working chamber 46 and the lower working chamber 48 during movement of the piston assembly 38 within the pressure tube 36. Since the piston rod 39 extends through the upper working chamber 46 and not the lower working chamber 48, movement of the piston assembly 38 with respect to the pressure tube 36 causes a difference in the amount of fluid displaced in the upper working chamber 46 and the amount of fluid displaced in the lower working chamber 48. The fluid displaced may flow through the base valve assembly 42, the piston assembly 38, or a combination thereof.

The reserve tube 40 surrounds the pressure tube 36 to define a fluid reservoir chamber 52 located between tubes 40 and 36. The bottom end of the reserve tube 40 is closed by a base cup 54 which can be connected to the unsprung mass of vehicle 10. The upper end of reserve tube 40 is attached to the rod guide assembly 50. The base valve assembly 42 is disposed between the lower working chamber 48 and the reservoir chamber 52 to control the flow of fluid between chambers 48 and 52. When the shock absorber 30 extends in length, an additional volume of fluid is needed in the lower working chamber 48. Thus, fluid may flow from the reservoir chamber 52 to the lower working chamber 48 through, for example, the base valve assembly 42. When the shock absorber 30 compresses in length, an excess of fluid must be removed from the lower working chamber 48, and therefore, fluid may flow from the lower working chamber 48 to the reservoir chamber 52 through the base valve assembly 42, the piston assembly 38, or a combination thereof.

The shock absorber 30 may include one or more electromechanical valves 34. The electromechanical valve 34 may be a digital valve, a variable state valve, or other suitable electromechanical valves. The electromechanical valve 34 may include a coil that controls the actuation of the electromechanical valve 34. More particularly, when power is supplied to the electromechanical valve 34, the coil creates a magnet field that actuates the electromechanical valve 34. The actuation of the electromechanical valve 34 controls the flow of fluid within the shock absorber 30. For example, the electromechanical valve 34 may control the flow of fluid between the upper working chamber 46 and the reservoir chamber 52.

While in the example embodiment the electrically adjustable hydraulic shock absorber is provided as having an electromechanical valve 34, the present disclosure is also applicable to electrically adjustable hydraulic shock absorbers that do not require an electromechanical valve. For example, the present disclosure is applicable to an electrically adjustable hydraulic shock absorber that uses magneto-rheological and electro-rheological damping technologies.

Figure 4:
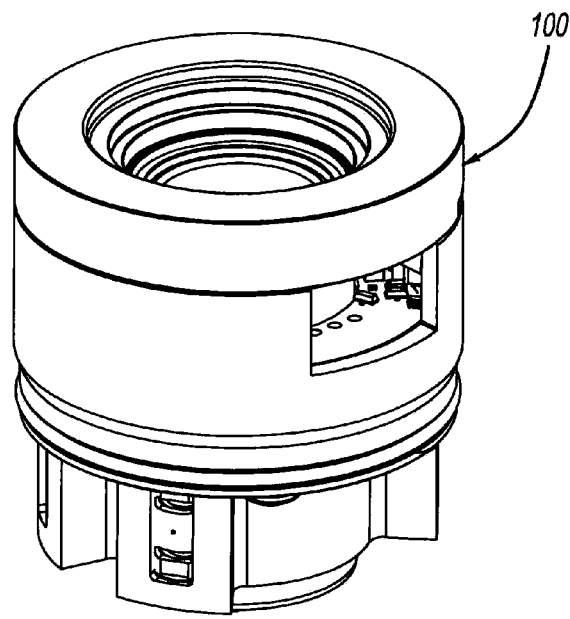
FIG. 4 is an enlarged perspective view of a housing which houses an integrated electronic system.
Figure 5:
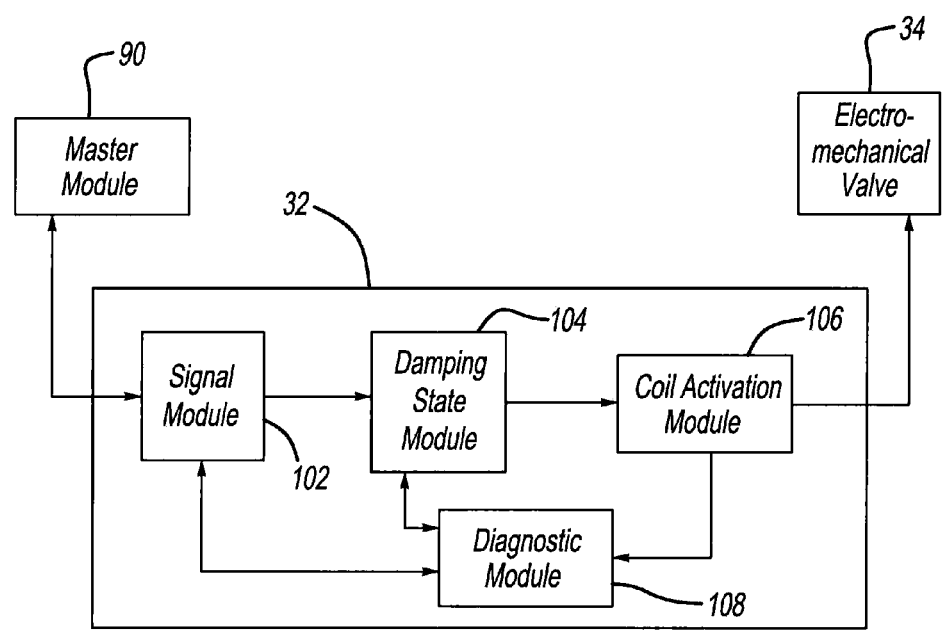
FIG. 5 is an example functional block diagram of the damper module.

With reference to FIGS. 4-5, an example of the DM 32 is presented. The DM 32 is disposed at the shock absorber 30 in a housing 100. The DM 32 controls the damping characteristics of the shock absorber. For example, in the example embodiment, the DM 32 may control the damping characteristics of the shock absorber 30 by controlling the actuation of the electromechanical valve 34 disposed within the shock absorber 30. Accordingly, each damper system 20 includes a DM that controls the operation of the shock absorber 30, as described in further detail below.

The DM 32 may receive a damper setting from a master module 90 disposed in the vehicle 10. More particularly, the DM 32 is communicably coupled to the master module 90 via a communication network. The master module 90 transmits data as an electronic signal via the communication network. The electronic signal may be an analog signal, a pulse width modulated (PWM) signal, CAN, LIN, or other type of signal/digital signal protocol known in the art. Based on the damper setting, the DM 32 controls the electromechanical valve(s) 34 disposed within the shock absorber 30, such that the shock absorber 30 operates at a target damping state.

With reference to FIG. 5, an example of the DM 32 is now presented. The DM 32 includes a signal module 102, a damping state module 104, a coil activation module 106, and a diagnostic module 108. The signal module 102 decodes the electronic signal received from a device external of the DM 32, such as the master module 90. For example, the signal module 102 receives the damper setting from the master module 90. The signal module 102 may also transmit data to the device external of the DM. For example, the signal module 102 may transmit data regarding a fault detected by the diagnostic module 108. It is readily understood that the signal module 102 may receive an electronic signal from other devices external of the DM 32, such as a switch, and is not limited to the master module 90.

The damping state module 104 determines a control operation for operating the shock absorber 30 at the target damping state based on the data received from the signal module 102. For example, based on the damper setting, the damping state module 104 determines a damping state of the shock absorber 30 and then controls actuation of the electromechanical valve 34 to operate the shock absorber 30 at the damping state determined. Similarly, if multiple electromechanical valves are disposed within the shock absorber 30, the damping state module 104 determines the appropriate activation/deactivation of each of the valves 34.

The damping state module 104 provides a control signal to the coil activation module 106 which in return controls the electrical power provided to a coil of the electromechanical valve 34. More particularly, the coil activation module 106 determines the inputs for a coil drive, as discussed below.

The diagnostic module 108 monitors the operation of the coil activation module 106 and the electromechanical valve 34 for any faults/failures. If a fault is detected the diagnostic module 108 may notify the damping state module 104. The damping state module 104 may then control the shock absorber 30 to a predetermined operation state.

As provided above, information regarding the fault may also be transmitted to a device external of the DM 32. For example, the diagnostic module 108 may transmit data regarding the fault to the signal module 102 which transmits the data to the master module 90.

Figure 7:
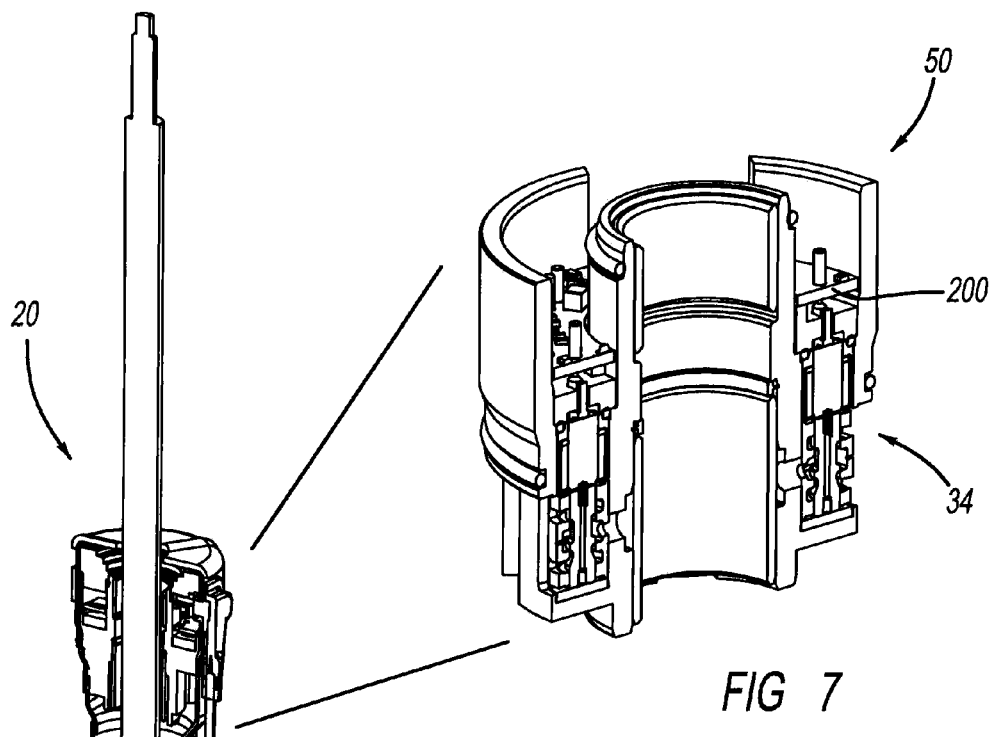
FIG. 7 is a cross-sectional view of the damper system with an enlarged view of a rod guide assembly having the PCBA.
Figure 6:
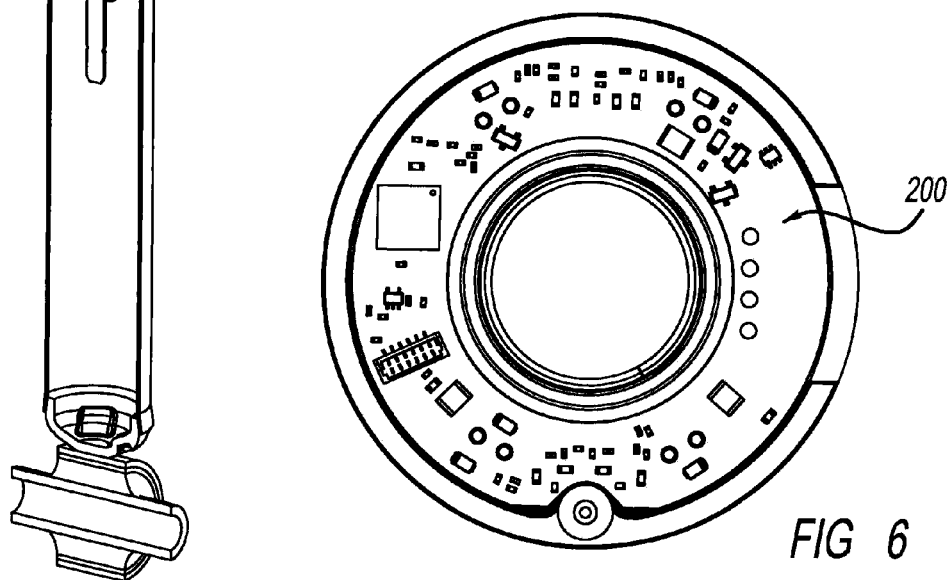
FIG. 6 illustrates a printed circuit board assembly (PCBA) disposed within the shock absorber.

In operation, the DM 32 controls the damping state of the electrically adjustable hydraulic shock absorber 30. The DM 32 is disposed within the housing 100 as an integrated electronic system. Specifically, as shown in FIGS. 6-7, the shock absorber 30 includes a printed circuit board assembly (PCBA) 200. The PCBA 200 is disposed at the shock absorber 30, and can be disposed within the housing 100. In the example embodiment the PCBA 200 is disposed within the rod guide assembly 50. The PCBA 200 is an integrated electronic system that electrically powers coil(s) via coil drivers to create a magnetic field. The magnetic field actuates the electromechanical valve 34 (i.e., a hydraulic valve), thereby adjusting the damping characteristic of the shock absorber 30.

Figure 8:
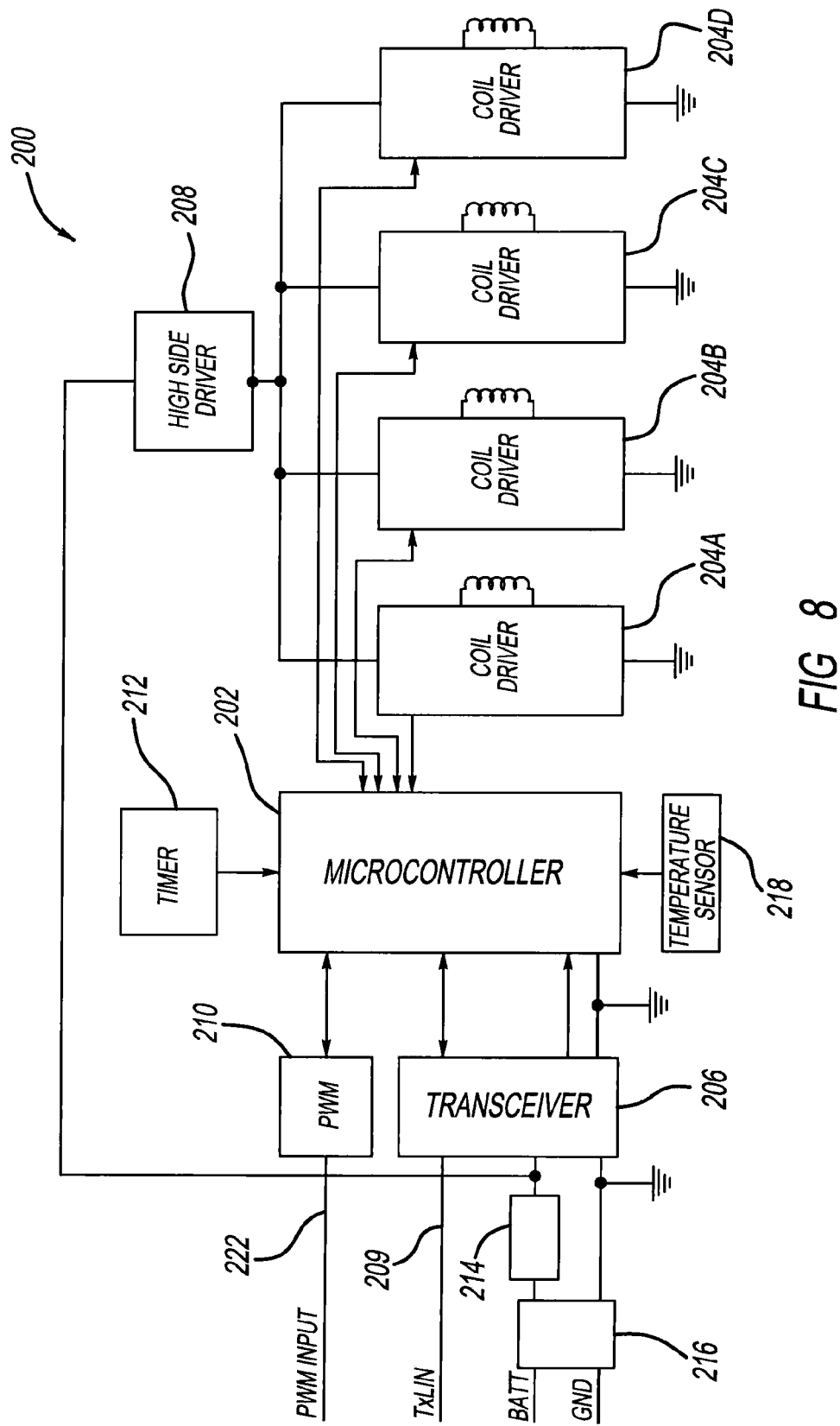
FIG. 8 is an example block diagram of the PCBA.

With reference to FIG. 8, an example block diagram of the PCBA 200 is shown. It is readily understood that the PCBA may include other components, and is therefore not limited to the components and/or configuration depicted. The PCBA 200 includes a microcontroller 202, coil drivers 204A, 204B, 204C, and 204D (hereinafter "coil drivers 204A-204D"), and a transceiver 206. The microcontroller 202 performs the functions of the DM 32. Specifically, microcontroller 202 performs the operation of the signal module 102, the damping state module 104, the coil activation module 106, and the diagnostic module 108.

As the coil activation module 106, the microcontroller 202 determines an input for each of the coil drivers 204A-204D. As power drive electronics, the coil drivers 204A-204D control current to, for example, the electromechanical valves based on the input (i.e., signal) from the microcontroller 202. While in the example embodiment four coil drivers are shown, it is readily understood that one or more coil drivers may be used based on the number of electromechanical valves/coils disposed within the shock absorber 30. Specifically, each electromechanical valve has a dedicated coil driver.

As the diagnostic module 108, the microcontroller 202 may monitor the electrical current powering each electromechanical valve 34 as it responds to a command to change the damper setting. Accordingly, the microcontroller 202 can monitor the electrical current levels to insure that the electrical components, such as the coil drivers 204A-204D and electromechanical valve coils, are working properly. Comparing the electrical current level to predetermined limits ensures coil drivers 204A-204D (i.e., the power drive electronics) are not experiencing a fault such as a short circuit, open circuit, temperature extreme, or other fault.

Additionally, with additional logic, the transient current profile, when recorded over time, can indicate the mechanical state of the electromechanical valve. As the electromechanical valve moves from the energized state to the unenergized state and vice versa, changes in the inductance of the electromechanical valve affect the electrical current. Inspection of this electrical current profile can, thus, determine the mechanical state of the electromechanical valve 34 as well as the electrical state.

The transceiver 206 may be provided as a LIN transceiver. The transceiver communicably couples the PCBA 200 to the communication bus provided as the communication link between the DM 32 and devices external of the DM 32, such as the master module 90. The communication bus may be a LIN bus 209 which is external of the PCBA 200.

The PCBA 200 may also include a high side driver 208, a PWM input 210, a timer 212, a voltage regulator 214, a protection circuit 216, and a temperature sensor 218. The high side driver 208 is electrically coupled to each of the coil drivers 204A-204D. The high side driver 208 acts like a master switch for controlling the power supply to each of the coil drivers 204A-204D. The PWM input 210 may be provided as an alternative communication link (reference number 222 in FIG. 8) for receiving an electronic signal from sensors/modules disposed external of the PCBA 200. The timer 212 may be a watchdog timer that monitors the operation of the microcontroller 202 and resets the microcontroller 202 if needed.

The temperature sensor 218 detects the ambient temperature of the PCBA 200. The temperature sensor 218 provides the information to the microcontroller 202. The microcontroller 202 may then determine the proper operation of the damper system 20 based on the temperature detected. Accordingly, the components disposed on the PCBA 200 are protected from extreme temperatures.

The PCBA 200 receives power from a vehicle battery. The voltage regulator 214 conditions the electrical power from the vehicle battery to a voltage level suitable for the components on the PCBA 200. The protection circuit 216 may be provided as a battery line load dump transient and reverse voltage protection circuit. The protection circuit protects the components of the PCBA 200 from electrical transients which could damage or disrupt proper operation of the components on the PCBA 200.

The PCBA 200 may couple to the power supply and the communication bus via a connector 202 (FIG. 2). The connector 202 may be configured to both electrically and communicably couple the PCBA 200 to the power supply and the communication bus, respectively. Alternatively, the PCBA 200 may be coupled via two separate connectors. One for coupling to the power supply and the other to couple to the communication bus.

With reference to FIGS. 9-13, example methods of integrating the PCBA 200 with the shock absorber 30 are presented. It is readily understood that the present disclosure is not limited to the configuration shown in FIGS. 9-13, and that other suitable configurations may be employed for integrating the PCBA 200 with the shock absorber 30.

Figure 9:
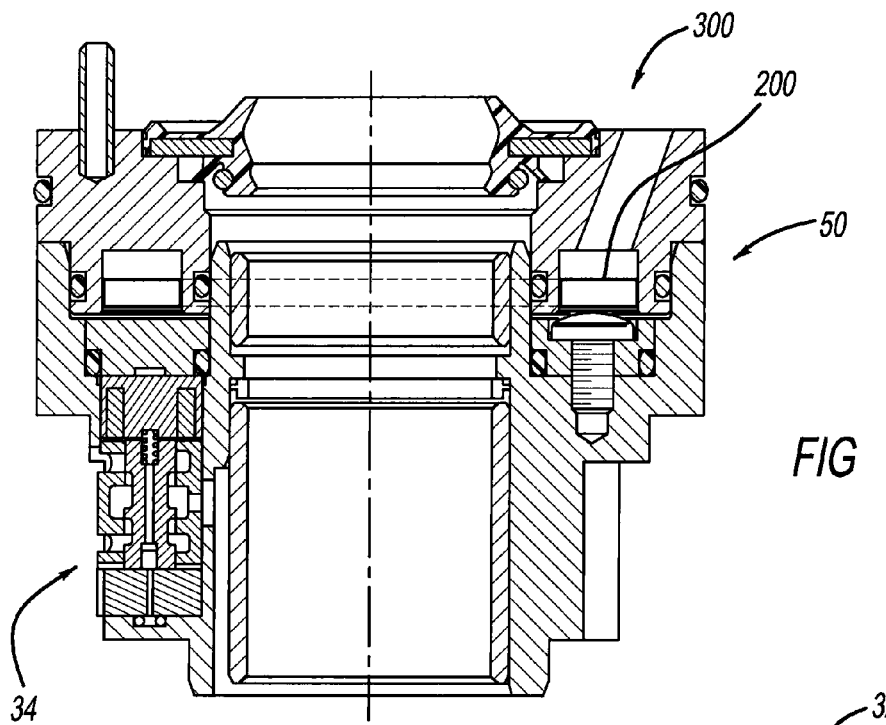
FIG. 9 illustrates an internal annular arrangement of the PCBA.

With reference to FIG. 9, an internal annular arrangement 300 is presented. In such an arrangement, the PCBA 200 is disposed within the rod guide assembly 50. Specifically the PCBA 200 has a ring-like structure, such that the piston rod 39 (not shown) may extend through the PCBA 200. The annular arrangement is also represented in FIGS. 6 and 7. In such a configuration, the PCBA 200 is directly coupled to the electromagnetic valve 34. Specifically, the coil driver disposed on the PCBA 200 is directly connected to the electromagnetic valve 34, thereby eliminating the need of an electrical connector.

Figure 10:
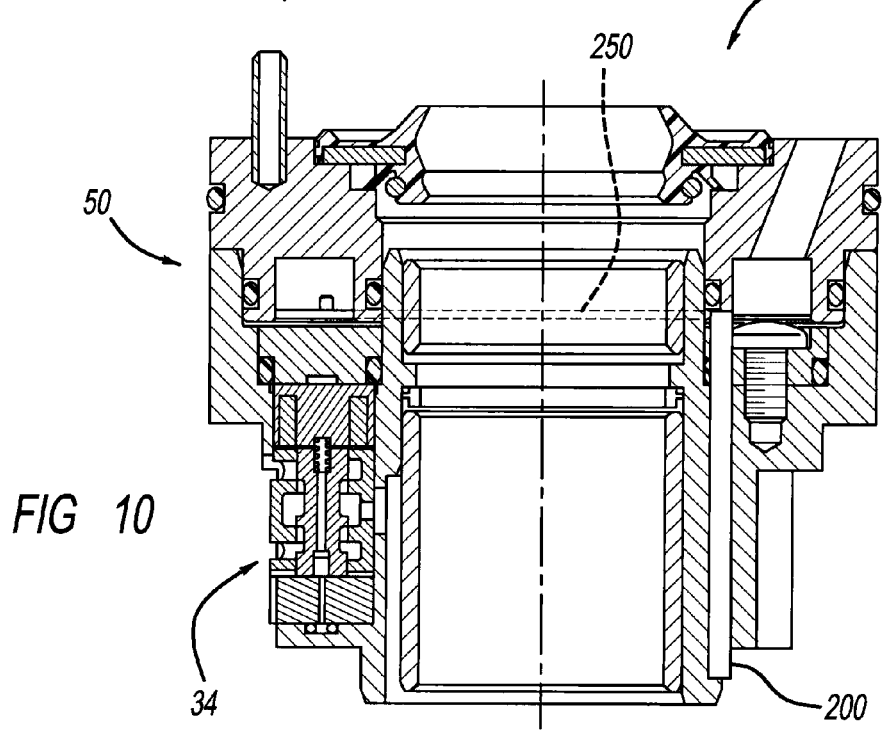
FIG. 10 illustrates an internal vertical arrangement of the PCBA.

With reference to FIG. 10, an internal vertical arrangement 320 is presented. The PCBA 200 is arranged vertically (i.e., parallel with the piston rod 39) and within the rod guide assembly 50. By arranging the PCBA 200 along a side surface of the rod guide assembly 50, the PCBA 200 is no longer limited to the annular shape. Specifically, the PCBA 200 may have a rectangular or square-like shape. A lead frame 250 provides an electrical connection between the coil drivers disposed on the PCBA 200 and the electromagnetic valve 34. Therefore, the PCBA 200 is connected to the electromagnetic valve 34 by way of the lead frame 250.

With reference to FIG. 11, an inverted-wet arrangement 340 is presented. The PCBA 200 is arranged between the pressure tube 36 and the reserve tube 40. Specifically, in the twin tube type shock absorber, the PCBA 200 may be disposed in the reservoir chamber 52. Such a configuration is provided as "wet" since the PCBA 200 is in contact with hydraulic fluid. For purposes of clarity, the pressure tube 36 and the reserve tube 40 are not shown in FIG. 11. While not shown in the figure, it is readily understood that the PCBA 200 is disposed in a housing that prevents the hydraulic fluid from entering the PCBA 200.

The lead frame 250 couples the PCBA 200 to the electromechanical valve. For example, the lead frame 250 couples the coil driver disposed on the PCBA 200 to an end of the electromagnetic valve 34 that is farthest from the rod guide assembly 50. Thus, the configuration has an inverted arrangement.

With reference to FIG. 12, an external arrangement 360 is presented. The PCBA 200 is arranged along an external surface of the shock absorber 30. The PCBA 200 can be disposed in a housing that protects the PCBA 200 from the environmental elements such as rain, humidity, debris, etc. The PCBA 200 is then coupled to the electromechanical valve 34 via a lead frame 254.

Figure 13:
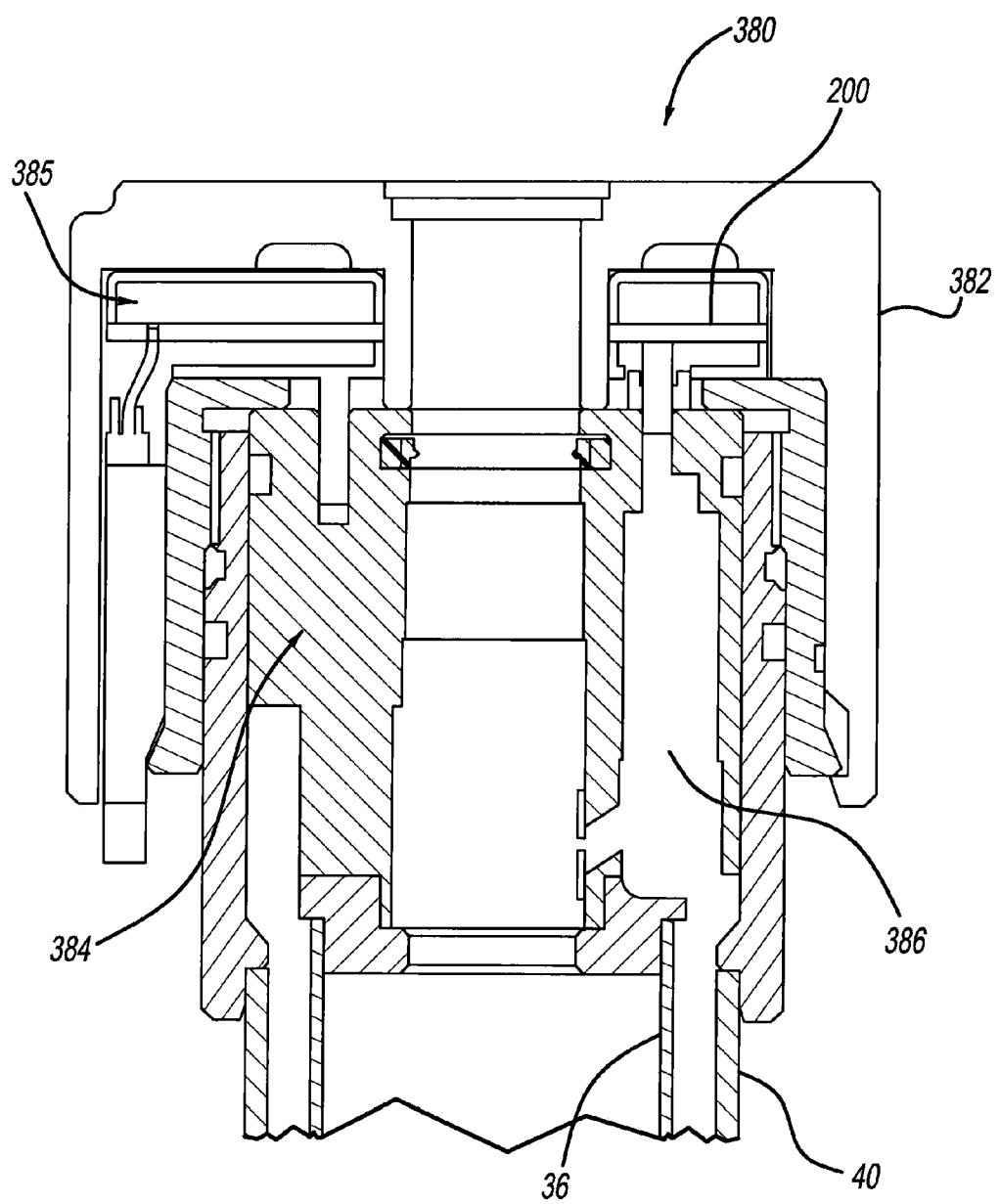
FIG. 13 illustrates a cap arrangement of the PCBA.

With reference to FIG. 13, a cap arrangement 380 is presented. The PCBA 200 is disposed within a cap 382. The cap 382 is positioned external to the shock absorber 30. More particularly, the cap 382 is attached to an end of the shock absorber 30. The PCBA 200 is disposed in a gap 385 defined between the cap 382 and the shock absorber 30. Specifically, the PCBA 200 can be disposed between the cap, the rod guide 384, and the reserve tube 40.

The cap 382 may or may not be a load bearing structure. Specifically the PCBA 200 has a ring like structure, such that the piston rod 39 (not shown) may extend through both the PCBA 200 and the cap 382. Furthermore, the PCBA 200 is electrically coupled to an electromechanical valve disposed within a valve cavity 386. Based on the distance between the PCBA 200 and the electromechanical valve, the PCBA 200 may be directly connected to the electromechanical valve or may be indirectly connected via, for example, a lead frame.

As provided above, the present disclosure is also applicable to electrically adjustable hydraulic shock absorbers that do not include an electromagnetic valve. For example, if the shock absorber utilizes magneto-rheological and electro-rheological damping technologies, the damping module may operate the shock absorber using known methods that utilize the magneto-rheological and electro-rheological damping technologies. Accordingly, instead of the electromechanical valve, the PCBA 200 controls the current supplied to a coil disposed within the shock absorber.

As provided above, the PCBA 200 is an integrated electronic system that electrically powers coil(s) to create a magnetic field. The magnetic field actuates the electromechanical valve (i.e., a hydraulic valve), thereby adjusting the damping characteristic of the shock absorber. By integrating an electronics system with the electrically adjustable hydraulic shock absorber, the complexity of a vehicle damping system/ suspension system is reduced. In essence, each damper system 20 includes its own power drive electronics for controlling the damping state of the shock absorber 30.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof.

When an element is referred to as being "on," "engaged to," "connected to," or "coupled to" another element, it may be directly on, engaged, connected or coupled to the other element, or intervening elements may be present. In contrast, when an element is referred to as being "directly on," "directly engaged to," "directly connected to," or "directly coupled to" another element, there may be no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements and/or components, these elements and/or components should not be limited by these terms. These terms may be only used to distinguish one element or component from another. Terms such as "first," "second," and other numerical terms when used herein do not imply a sequence or order unless clearly indicated by the context. Thus, a first element or component discussed could be termed a second element or component without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A damper system for a vehicle, the damper system comprising:
a piston rod;
a rod guide assembly;
an electromechanical valve radially offset from the piston rod and disposed at least substantially within the rod guide assembly;
an electrically adjustable hydraulic shock absorber including a reserve tube;
a printed circuit board assembly having power drive electronics and electrically coupled to the shock absorber; and
the printed circuit board having a generally annular shape and aligned generally perpendicular to a longitudinal axis of the piston rod; and
the printed circuit board further being positioned to be axially offset from the electromechanical valve and in communication with the electromechanical valve.

2. The damper system of claim 1 further comprising:
a housing, wherein the printed circuit board assembly is disposed within the housing and connected to the electromechanical valve.

3. The damper system of claim 1 wherein
the piston rod extends through the rod guide assembly, and
the printed circuit board assembly is disposed within the rod guide assembly of the shock absorber, such that the piston rod extends through the rod guide assembly and an opening in the printed circuit board assembly, and the printed circuit board assembly is directly coupled to the electromechanical valve.

4. A damper system for a vehicle, the damper system comprising:
an electrically adjustable hydraulic shock absorber including a rod guide assembly, a pressure tube, a reserve tube and an electromechanical valve, the electromechanical valve being disposed at least substantially inside the rod guide assembly; and
an integrated electronic system having power drive electronics, wherein the power drive electronics is electrically coupled to the electromechanical valve, and the integrated electronic system is disposed along an axis parallel to a longitudinal axis of the pressure tube, and at a location radially outwardly of the pressure tube adjacent the rod guide assembly.

5. The damper system of claim 4 wherein the power drive electronics is coupled to the electromechanical valve via a lead frame.

6. A damper system for a vehicle, the damper system comprising:
a piston rod;
an electrically adjustable hydraulic shock absorber including a reserve tube;
an electromechanical valve including a coil, the electromechanical valve being housed at least substantially in a rod guide assembly and being radially offset from the piston rod;
a printed circuit board assembly having power drive electronics and electrically coupled to the shock absorber;
a housing forming a circumferential cap and being operably coupled to the reserve tube; wherein
the printed circuit board is disposed within the circumferential cap and confined entirely within the circumferential cap; and
wherein the printed circuit board is axially offset from the electromechanical valve and arranged perpendicular to a longitudinal axis of the electromechanical valve, and in communication with the electromechanical valve.

7. A damper system for a vehicle, the damper system comprising:
an electrically adjustable hydraulic shock absorber including a reserve tube;
a printed circuit board assembly having power drive electronics and electrically coupled to the shock absorber;
the shock absorber includes a pressure tube; and
the printed circuit board assembly is disposed between the pressure tube and reserve tube.

8. A damper system for a vehicle, the damper system comprising:
an electrically adjustable hydraulic shock absorber including a reserve tube and an electromechanical valve;
an integrated electronic system having power drive electronics, wherein the power drive electronics is electrically coupled to the electromechanical valve;
the shock absorber includes a pressure tube, the pressure tube and the reserve tube defining a reservoir chamber there between; and
the integrated electronic system is disposed within the reservoir chamber.

* * * * *